United States Patent
Matsumura et al.

(10) Patent No.: US 7,067,402 B2
(45) Date of Patent: Jun. 27, 2006

(54) PRODUCTION METHOD FOR SIMOX SUBSTRATE AND SIMOX SUBSTRATE

(75) Inventors: Atsuki Matsumura, Futtsu (JP);
 Keisuke Kawamura, Futtsu (JP);
 Yoichi Nagatake, Futtsu (JP); Seiji Takayama, Futtsu (JP)

(73) Assignee: Nippon Steel Corporation, Tokyo (JP)

( * ) Notice: Subject to any disclaimer, the term of this patent is extended or adjusted under 35 U.S.C. 154(b) by 205 days.

(21) Appl. No.: 10/473,692

(22) PCT Filed: Mar. 28, 2002

(86) PCT No.: PCT/JP02/03127

§ 371 (c)(1),
(2), (4) Date: Sep. 29, 2003

(87) PCT Pub. No.: WO02/080276

PCT Pub. Date: Oct. 10, 2002

(65) Prior Publication Data
US 2004/0171228 A1 Sep. 2, 2004

(30) Foreign Application Priority Data
Mar. 28, 2001 (JP) ............................. 2001-093227

(51) Int. Cl.
*H01L 21/762* (2006.01)
(52) U.S. Cl. .................................................. 438/480
(58) Field of Classification Search ................ 438/423, 438/480
See application file for complete search history.

(56) References Cited

U.S. PATENT DOCUMENTS 4,786,608 A * 11/1988 Griffith ..................... 438/766
4,975,126 A 12/1990 Margail et al.

(Continued)

FOREIGN PATENT DOCUMENTS

EP 738004 10/1996

(Continued)

OTHER PUBLICATIONS

Nakashima et al., 1996, "Investigations on High-Temperature Thermal Oxidation Process at Top and Bottom Interfaces of Top Silicon of SIMOX Wafers" Journal of Materials Research Society, vol. 8, No. 3, 523-534.

(Continued)

*Primary Examiner*—W. David Coleman
(74) *Attorney, Agent, or Firm*—Baker Botts L.L.P.

(57) ABSTRACT

A Separation by Implanted Oxygen ("SIMOX") substrate and method for making thereof are provided. The SIMOX substrate can be produced by employing an oxygen ion implantation amount in a low dose range. The substrate is a high quality SOI substrate having an increased thickness of a BOX layer. More specifically, the SIMOX substrate and method for making the same are provided such that a buried oxide layer and a surface silicon layer are formed by applying the implantation of oxygen ions in a silicon substrate and a high temperature heat treatment thereafter. A buried oxide layer is provided by applying a high temperature heat treatment after an oxygen ion implantation; then applying an additional oxygen ion implantation so that the peak position of the distribution of implanted oxygen is located at a portion lower than the interface between the buried oxide layer, already formed, and the substrate thereunder. Then, another high temperature heat treatment is applied. The SIMOX substrate has a surface silicon layer 10 to 400 nm in thickness and a buried oxide layer 60 to 250 nm in thickness.

16 Claims, 7 Drawing Sheets

U.S. PATENT DOCUMENTS

| | | | |
|---|---|---|---|
| 5,395,771 | A | 3/1995 | Nakato |
| 5,918,151 | A * | 6/1999 | Tachimori et al. .......... 438/766 |
| 6,043,166 | A * | 3/2000 | Roitman et al. ............ 438/766 |
| 6,461,933 | B1 * | 10/2002 | Houston ..................... 438/423 |
| 6,541,356 | B1 * | 4/2003 | Fogel et al. ................ 438/480 |
| 6,737,332 | B1 * | 5/2004 | Fuselier et al. ............ 438/423 |
| 2002/0022348 | A1 * | 2/2002 | Sakaguchi et al. ......... 438/480 |

FOREIGN PATENT DOCUMENTS

| | | |
|---|---|---|
| JP | 0117444 | 1/1989 |
| JP | A-1-17444 | 1/1989 |
| JP | 04249323 | 9/1992 |
| JP | A-4-249323 | 9/1992 |
| JP | 5291543 | 11/1993 |
| JP | 6132394 | 5/1995 |
| JP | 07263538 | 10/1995 |
| JP | A-7-263538 | 10/1995 |
| JP | 7335847 | 12/1995 |
| JP | 0150408 | 5/2000 |
| JP | 2002-231651 * | 8/2002 |

OTHER PUBLICATIONS

Nakashima et al., 1993, "Analysis of buried oxide layer formation and mechanism of threading dislocation generation in the substoichiometric oxygen dose region" Journal of Electrochemical Society, vol. 143, No. 1, 244-251.

S. Nakashima et al., "Investigations on High-Temperature Thermal Oxidation Process at Top and Bottom Interfaces of Top Silicon of SIMOX Wafers," J. Electrochemical Society, Japan, vol. 143, No. 1, pp. 244-251, Jan. 1996.

Sadao Nakashima et al., "Analysis of buried oxide layer formation and mechanism of therading dislocation generation in the substoichiometric oxygen dose region," Journal of Materials Research Society, Japan, vol. 8, No. 3, pp. 523-534, Mar. 1993.

* cited by examiner

1) AFTER FIRST OXYGEN ION IMPLANTATION

OXYGEN CONCENTRATION DISTRIBUTION

2) AFTER FIRST HIGH TEMPERATURE HEAT TREATMENT

OXYGEN CONCENTRATION DISTRIBUTION

3) AFTER SECOND OXYGEN ION IMPLANTATION (AT HIGH ACCELERATING VOLTAGE)

OXYGEN CONCENTRATION DISTRIBUTION

4) AFTER SECOND HIGH TEMPERATURE HEAT TREATMENT

OXYGEN CONCENTRATION DISTRIBUTION

3) ETCHING OF SOI LAYER SURFACE

4) AFTER SECOND OXYGEN ION IMPLANTATION
O⁺  O⁺  O⁺

OXYGEN CONCENTRATION DISTRIBUTION

5) AFTER SECOND HIGH TEMPERATURE HEAT TREATMENT

OXYGEN CONCENTRATION DISTRIBUTION

3) FORMATION OF SURFACE OXIDE LAYER

4) AFTER REMOVAL OF OXIDE LAYER

OXYGEN CONCENTRATION DISTRIBUTION

5) AFTER SECOND OXYGEN ION IMPLANTATION

OXYGEN CONCENTRATION DISTRIBUTION

6) AFTER SECOND HIGH TEMPERATURE HEAT TREATMENT

OXYGEN CONCENTRATION DISTRIBUTION

PRODUCTION METHOD FOR SIMOX SUBSTRATE AND SIMOX SUBSTRATE

CROSS-REFERENCE TO RELATED APPLICATION(S)

This application is a national stage application of PCT Application No. PCT/JP02/03127 which was filed on Mar. 28, 2002 and published on Oct. 10, 2002 as International Publication No. WO 02/080276 (the "International Application"). This application claims priority from the International Application pursuant to 35 U.S.C. § 365. The present application also claims priority under 35 U.S.C. § 119 from Japanese Patent Application No. 2001-093227, filed on Mar. 28, 2001, the entire disclosure of which is incorporated herein by reference.

FILED OF THE INVENTION

The present invention relates to an SOI substrate having a buried oxide layer near a surface of a silicon substrate and a single crystal silicon surface layer (hereinafter called an SOI layer, meaning a silicon-on-insulator layer) formed thereon.

BACKGROUND INFORMATION

A Separation by Implanted Oxygen ("SIMOX") wafer and a bonded wafer are known as typical examples of an SOI substrate which has a single crystal silicon layer formed on an insulating material such as silicon dioxide. The SIMOX wafer is an SOI substrate obtained by: introducing oxygen ions inside a single crystal silicon substrate through the ion implantation of oxygen ions; having the oxygen ions react with silicon atoms through a subsequent annealing process, and thus forming a Buried Oxide layer (hereinafter called a BOX layer). The bonded wafer, on the other hand, is an SOI substrate obtained by: bonding two single crystal silicon wafers, with an oxide layer in between; and then turning one of the two wafers into a thin film.

A Metal-Oxide-Semiconductor Field Effect Transistor ("MOSFET") formed in the SOI layer of such an SOI substrate has high radiation resistance and high latch-up resistance, shows high reliability, suppresses a short channel effect which tends to occur as a device size becomes smaller, and enables an operation with low power consumption, as well. In addition, because the operating region of a device is isolated from the substrate itself in terms of dielectric capacitance, signal transmission speed is enhanced, and thus high-speed operation of the device is realized. For those reasons, the SOI substrate has been the most promising candidate of a high performance semiconductor substrate for MOS-LSIs of the next generation.

Among the variety of the SOI substrates, the SIMOX wafer has an advantage in its excellent uniformity of the thickness of the SOI layer. In the SIMOX wafer, it is possible to form an SOI layer 0.4 µm or less in thickness and even to control the thickness of the SOI layer to 0.1 µm, or even smaller. An SOI layer 0.1 µm or less in thickness, for example, can be used for forming a MOS-LSI for fully depletion type operation. In this case, as the thickness of the SOI layer itself is in a proportional relationship with the threshold voltage of a MOSFET, the uniformity of the thickness of the SOI layer constitutes an important quality aspect for producing devices of uniform performance at a high yield. In this regard, the SIMOX wafer having an SOI layer excellent in uniformity of the thickness has been the most promising candidate of the substrates for MOSFETs of the next generation.

A MOS-LSI formed on an SOI substrate is capable of realizing the excellent properties described above, such as the enhanced radiation resistance and latch-up resistance, the operation with low power consumption, the ultra-high-speed operation, etc., due the device active area being dielectrically isolated from the substrate itself by laying the BOX layer which is an insulator between them. In this respect, the BOX layer should have as perfect an insulating property as possible. More particularly, it is needed that the density of leak defects in the BOX layer (hereinafter called pinhole defects) are as low as possible and the dielectric breakdown property is as close to that of a thermally-grown oxide layer as possible.

In the production of a SIMOX wafer, oxygen ions are implanted by applying, usually, a fixed amount of accelerating energy, typically, an accelerating voltage of 200 kV or so. It is widely known that, in the SIMOX structure formed after a high temperature heat treatment, a continuous, uniform and high quality BOX layer can be obtained only when the implantation dosing amount of the oxygen ions is $1.5 \times 10^{18}$ cm$^{-2}$ or more, or within a limited range from 2.5 to $4.5 \times 10^{17}$ cm$^{-2}$ (refer to S. Nakashima and K. Izumi, the Journal of Materials Research, Vol. 8, p. 523 (1993), for example). The SIMOX wafer produced by implanting the oxygen ion amount specified above is conventionally called: a high dose SIMOX substrate when produced by implanting the oxygen ion amount in the former range; or a low dose SIMOX substrate when produced by implanting the oxygen ion amount in the latter range.

The high dose SIMOX substrate and the low dose SIMOX substrate have respective characteristics, and they are used for different applications according to the characteristics. Out of the two types of SIMOX substrates, in the case of the low dose SIMOX substrate, the dosing amount of oxygen ion implantation is comparatively small, therefore the threading dislocation density of the SOI layer is decreased, and the low dose SIMOX substrate is expected to be a technology capable of realizing low-cost production. The low dose SIMOX substrate, however, has problems such as the relatively large density of pinhole defects in the BOX layer, the high probability of dielectric breakdown property of the BOX layer becoming insufficient and so forth, because the BOX layer is thin. With regard to the BOX quality of the low dose SIMOX substrate, when it is attempted to increase the thickness of the BOX layer by simply increasing the oxygen ion implantation amount, although the pinhole defects decrease, granular substances consisted of silicon (hereinafter referred to silicon islands) are generated in quantities inside the BOX layer and, as a result, the breakdown electric field of the BOX layer is lowered. However, it has been pointed out that, when the oxygen ion implantation dosing amount is decreased, in contrast, though the silicon islands decrease and the breakdown electric field of the BOX layer is improved, the density of the pinhole defects increases as the oxygen ion implantation dosing amount decreases. It has therefore been very difficult to simultaneously improve the whole quality of the BOX layer in the low dose SIMOX substrate produced according to a conventional technology.

As a solution to contribute to the quality improvement of the BOX layer of the low dose SIMOX substrate, a technology has been proposed which makes use of internal oxidation at a high temperature (internal thermal oxidation process, hereinafter called the ITOX technology in abbreviation) (see Japanese Patent Publication No. H07-263538, or S. Nakashima et al., The Journal of Electrochemical Society, Vol. 143, p. 244). According to the ITOX technology, a thermally-grown oxide layer grows on the substrate surface through an oxidation treatment at a high temperature, and, at the same time, some amount of thermally-grown oxide layer at the upper interface of the BOX layer, and thus it becomes possible to make the BOX layer thicker. Further, it has been reported that the pinhole defects are decreased as a result, and the breakdown electric field is improved at the same time. In the ITOX technology, however, it is most likely for the surface oxide layer to grow by not less than 10 times the increase in the thickness of the BOX layer. For this reason, to secure a prescribed thickness of the SOI layer in the SIMOX structure finally obtained, it may be necessary to restrict the amount of oxidation of the substrate surface. As a consequence, there has been a natural limit in the increment of the BOX layer thickness.

As a measure to make the BOX layer of a SIMOX substrate thicker without being influenced by the above restriction, it has been proposed that, in a method wherein a series of oxygen ion implantations is conducted while changing the average depth of the implantation step-by-step or continuously and a heat treatment at a high temperature is applied thereafter, the cumulative distribution of implanted oxygen is controlled so that it falls, after the series of oxygen ion implantation, within a range in which the silicon islands are not generated, and that the distribution has a single peak so as to form a single BOX layer after the high temperature heat treatment (see Japanese Patent Publication No. H7-201975). With this technique, it is theoretically possible to obtain a high quality BOX layer even under dosing conditions outside the so-called dose window, under which dosing conditions it is impossible to obtain a good quality BOX layer when the oxygen ion is implanted using a fixed accelerating voltage. However, it is necessary, in the proposed technique, to control the peak value of the distribution of implanted oxygen to not more than $2.25 \times 10^{22}$ cm$^{-3}$, i.e. about a half of $4.48 \times 1022$ cm$^{-3}$, which is the oxygen concentration in silicon dioxides, in order to prevent the silicon islands from forming in the BOX layer, and, if a plurality of peaks appear in the distribution of implanted oxygen after the series of oxygen ion implantation caused by changes in process conditions or other factors, precipitation takes place during the high temperature heat treatment around each of the peaks and a single BOX layer is not formed. Because of the unstable nature of the proposed method as described above, it has a problem that precise and delicate control of the process is required in order to avoid the instability.

In the meantime, as a possible solution in which oxygen ion implantation and high temperature heat treatment are repeated, a technology has been proposed wherein oxygen ion implantation at a fixed accelerating energy and high temperature heat treatment are repeated for the purpose of improving the quality of a high dose SIMOX substrate (see Japanese Unexamined Patent Publication No. H1-17444). The object of the proposed technology is to reduce defects, such as threading dislocations, in the SOI layer finally obtained by reducing the damage generated in the substrate at each step of the implantation through dividing the implantation of a required dosing amount into a plurality of steps and recovering further from the reduced damage through applying a high temperature heat treatment after each of the implantation steps. In this technique, however, the implantation of the oxygen ion amount conventionally employed for producing a high dose SIMOX substrate is divided into several steps, and it causes no change in the thickness of the BOX layer finally obtained. Besides, it has been pointed out that, using the technique, waviness occurs conspicuously in the BOX layer formed at an intermediary step and, as a consequence, the flatness of the interface of the BOX layer finally obtained is deteriorated.

As a measure to avoid the problem, a proposal has been made, wherein the implantation is divided into two steps and a lower accelerating energy than that in the first step implantation is applied in the second step implantation, and by so doing, oxygen ions are implanted preponderantly at the interface of the BOX layer formed after the first step heat treatment and the SOI layer, and thus the flatness of the interface is improved (see Japanese Patent Publication No. H4-249323). However, this technology is also an invention aiming at improving the quality of the high dose SIMOX substrate and, as the implantation of the total oxygen ion amount conventionally employed for producing a high dose SIMOX substrate is divided into steps, like in the previous example, it causes no change in the thickness of the BOX layer finally obtained. In addition, because the oxygen ions are implanted in the second step on the upper side of the BOX layer already formed in the first step, the SOI layer finally obtained tends to be thin. The proposed technology is, therefore, not suitable for increasing the thickness of the BOX layer while maintaining the thickness of the SOI layer.

The entire disclosures of all publications referred to herein are incorporated by reference in their entireties.

SUMMARY OF THE INVENTION

One of the objects of the present invention is to provide a technology capable of increasing the thickness of the buried oxide layer of the SIMOX substrate without the above difficulties. In particular, an exemplary object of the present invention is to provide a high quality SOI substrate for a high performance LSI by making it possible to increase the thickness of the BOX layer of a SIMOX substrate produced by employing the oxygen ion implantation amount in the low dose range, keeping good quality of the BOX layer, and a method of producing the SOI substrate.

In the SIMOX method, an SOI structure can be formed by applying the implantation of oxygen ions into a single crystal silicon substrate and a heat treatment at a high temperature thereafter, the present inventors newly discovered that it is possible to increase the thickness of the BOX layer, while maintaining the thickness and crystallinity of the SOI layer and suppressing the formation of the silicon islands in the BOX layer, if, after a BOX layer is once formed through a high temperature heat treatment, oxygen ions are implanted again in a position deeper than the BOX layer thus formed and then a heat treatment at a high temperature is applied once again. The present invention, therefore, relates to a method of producing an SOI substrate which solves the above problems and, further, to the SOI substrate produced by applying the technologies of the method, and it is realized as follows.

According to an exemplary embodiment of the present invention, a method of producing a SIMOX substrate is provided, in which a BOX layer and an SOI layer are formed by applying the implantation of oxygen ions into a silicon substrate and a heat treatment at a high temperature thereafter. In particular, a BOX layer can be formed by applying a high temperature heat treatment after an oxygen ion implantation, and then oxygen ion implantation can be repeatedly applied so that the peak position of the distribution of implanted oxygen is located at a portion lower than the interface between the formed BOX layer and the substrate thereunder, and a heat treatment is further applied at a high temperature thereafter.

Further, a method of producing a SIMOX substrate according to the above description can be provided such that the dosing amount of an additional oxygen ion implantation does not exceed the total dosing amount of the oxygen ions implanted earlier. In another exemplary method according to the present invention, the accelerating energy applied to the oxygen ion implantation may be different from that applied to an additional oxygen ion implantation. In addition, the surface of the SOI layer already formed can be partially removed before the additional oxygen ion implantation. Such surface removal may be performed by etching using a reactive substance, after oxidizing the surface and removing the oxide layer, and/or by surface polishing.

According to another exemplary embodiment of a method for producing a SIMOX substrate according to the present invention, it may be desirable that the number of repetitions of the oxygen ion implantation and the high temperature heat treatment can be two. Further, in any of the methods of producing a SIMOX substrate according to the present invention, it is possible to form an oxide layer on the surface of the silicon substrate prior to the oxygen ion implantation, and to remove the oxide layer after the oxygen ion implantation or the high temperature heat treatment.

In still another exemplary embodiment of a method for producing a SIMOX substrate according to the present invention, it can be desirable that the oxygen ion implantation is conducted under a condition of an accelerating energy of 150 to 250 keV and a dosing amount of 2 to $6 \times 10^{17}$ cm$^{-2}$, that an additional oxygen ion implantation is conducted under a condition of an accelerating energy of 150 to 250 keV and a dosing amount of 0.1 to $6 \times 10^{17}$ cm$^{-2}$, and that the total depth of the removal of the silicon surface is 20 nm to 300 nm.

According to the exemplary embodiment of the SIMOX substrate produced by applying any of the methods according to the present invention, the thickness of the SOI layer of the SIMOX substrate may be 10 nm to 400 nm, and the thickness of the BOX layer thereof is 60 nm to 250 nm. The BOX layer can be similar to that of a conventional low dose SIMOX substrate is once formed through an oxygen ion implantation and a high temperature heat treatment. For this reason, when the oxygen implanted at an additional oxygen ion implantation precipitates during the subsequent high temperature heat treatment, the precipitation can take place stably because the BOX layer already formed exists and the precipitating oxygen is absorbed in the BOX layer. As a result, it is possible to obtain a single BOX layer stably. In addition, according to the present invention, it is also possible to increase the thickness of the BOX layer and, at the same time, reduce the density of the pinhole defects in the BOX layer.

DETAILED DESCRIPTION

Exemplary embodiments of the present invention are explained hereafter based on the schematic sectional illustrations in FIGS. 1 to 4.

Figure 1:
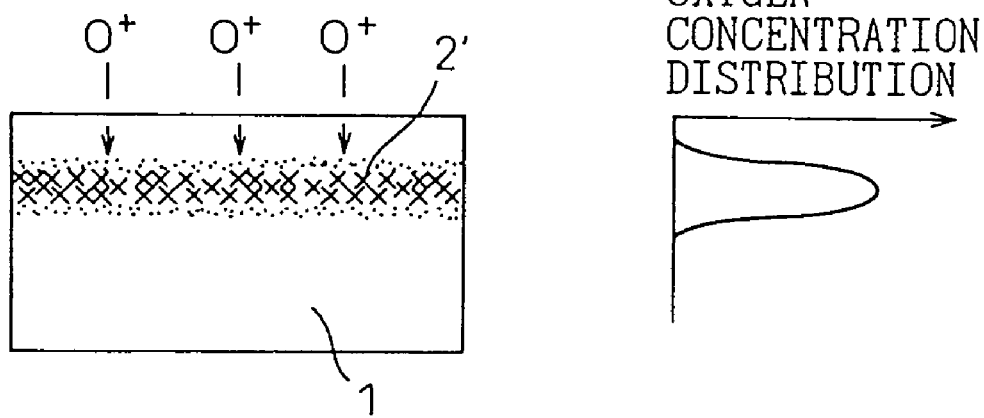
FIG. 1 shows production processes (1) and (2) of a SIMOX substrate according to a conventional technology and schematic sectional illustrations of silicon substrates at these production processes and, distributions of oxygen concentration in the silicon substrates.
Figure 1:
Figure 1:
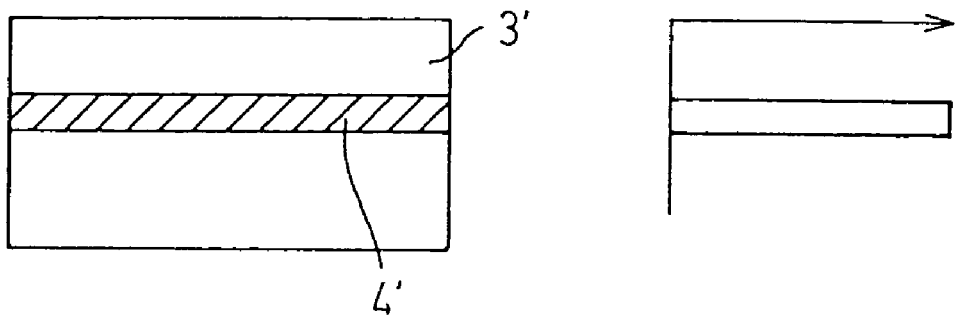

The first half of the processes to produce a SIMOX substrate according to an embodiment of the present invention employs the production processes of the SIMOX substrate according to a conventional technology shown in FIG. 1. In the processes shown in FIG. 1, (1) an oxygen implanted zone 2' is formed by charging a single crystal silicon substrate 1 into an ion implantation apparatus and implanting oxygen ions up to a prescribed dosing amount in the surface of the substrate, while heating the substrate so as to maintain its crystallinity. Then, the substrate is discharged from the ion implantation apparatus and, (2) a SIMOX structure having an SOI layer 3' and a BOX layer 4' is formed by applying a high temperature heat treatment in a heat treatment furnace. It has to be noted that, when forming a SIMOX substrate in a low dose range by applying, for instance, an accelerating voltage of 150 to 250 kV for the oxygen ion implantation, it is desirable, to obtain a high quality BOX layer, to apply a dosing amount of 2 to $6 \times 10^{17}$ cm$^{-2}$ as the prescribed dosing amount. The oxygen ion implantation and the high temperature heat treatment described above are called the first oxygen ion implantation and the first high temperature heat treatment, respectively, in the explanations of this description.

Figure 2:
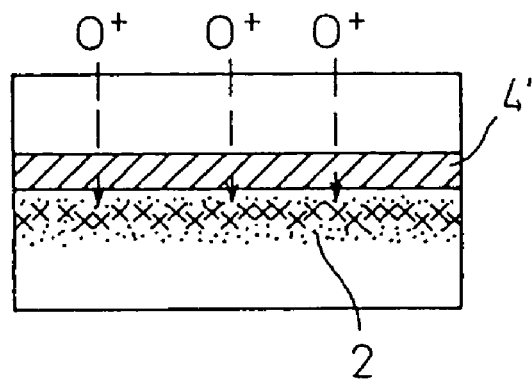
FIG. 2 shows exemplary production processes (3) and (4) of a SIMOX substrate according to a first embodiment of the present invention and schematic sectional illustrations of silicon substrates at these production processes and distributions of oxygen concentration in the silicon substrates.
Figure 2:
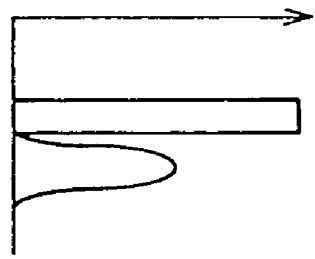
Figure 2:
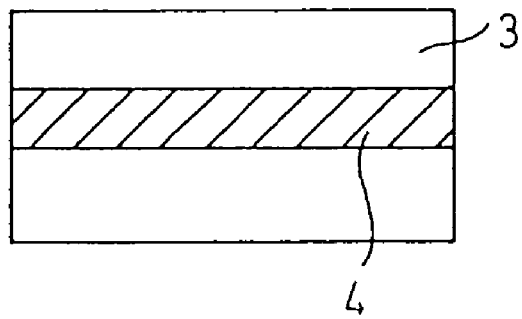
Figure 2:
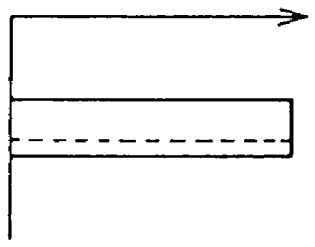

In the first embodiment of the present invention shown in FIG. 2, after completing the processes shown in FIG. 1, the substrate is charged into the ion implantation apparatus again, and 3) an oxygen ion implanted zone 2 is formed by applying oxygen ion implantation under such an accelerating voltage that the peak of the distribution of the implanted oxygen ions is located at the lower portion of the already formed BOX layer 4'. After that, the substrate is discharged from the ion implantation apparatus and, then, (4) a SIMOX structure having an SOI layer 3 and a BOX layer 4 is formed by applying a high temperature heat treatment in a heat treatment furnace. The oxygen ion implantation and the high temperature heat treatment described above are called the second oxygen ion implantation and the second high temperature heat treatment, respectively, in the explanations of this description.

By the method shown in FIG. 2, the oxygen ions implanted at the second oxygen ion implantation aggregate onto the already formed BOX layer 4' from the lower side during the subsequent second high temperature heat treatment. In order to realize the stable aggregation of the oxygen ions in the above process, it is desirable to control the dosing amount of the oxygen ions of the second oxygen ion implantation so as not to exceed that of the first oxygen ion implantation. By so doing, the precipitation of the oxygen ions proceeds during the second high temperature heat treatment so that the oxygen ions implanted at the second oxygen ion implantation aggregate in priority to the BOX layer 4' already formed, without precipitating them independently. What is more, as the precipitation process from the second oxygen ion implantation to the second high temperature heat treatment hardly affects the upper interface of the BOX layer 4', as a result, the BOX layer 4 is made thicker, maintaining good uniformity of the thickness of the SOI layer.

As is well known, the damage inflicted on the material wherein ions are implanted by the implanted ions becomes larger as the ions lose their energy and decelerate in the material wherein ions are implanted. The degree of the damage inflicted on the material wherein ions are implanted by the implanted ions, therefore, becomes large at the vicinity immediately above the position where the ions halt. By the method shown in FIG. 2, it is possible to concentrate the damage generated in a substrate by the second ion implantation on the inside or lower portion of the BOX layer 4' formed during the first high temperature heat treatment. For this reason, it is possible to suppress the new damage to the already formed SOI layer 3' generated by the second oxygen ion implantation and, as a result, to suppress the generation of defects such as threading dislocations in the SOI layer 3 formed after the second high temperature heat treatment.

Figure 3:
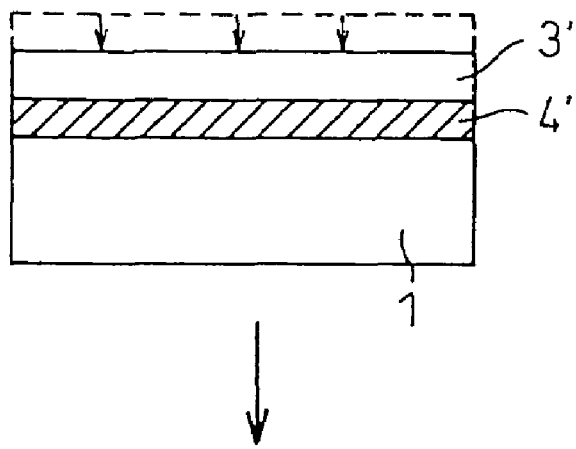
FIG. 3 shows exemplary production processes (3), (4) and (5) of a SIMOX substrate according to a second embodiment of the present invention and schematic sectional illustrations of silicon substrates at the production processes, and distributions of oxygen concentration in the silicon substrates.
Figure 3:
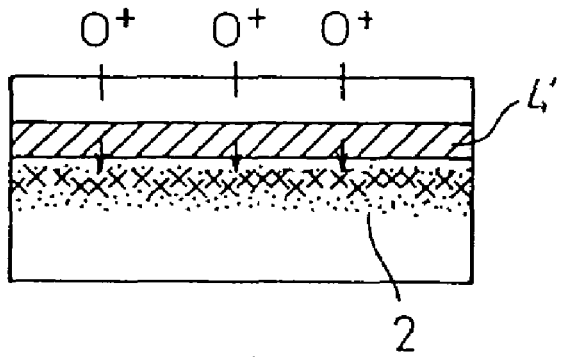
Figure 3:
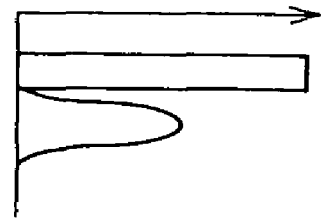
Figure 3:
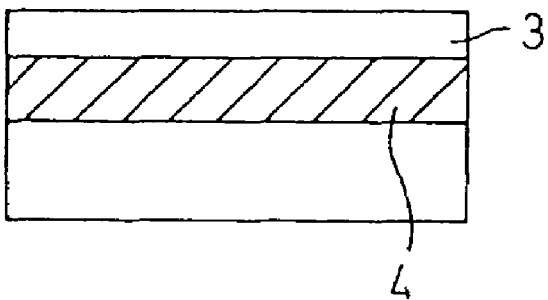
Figure 3:
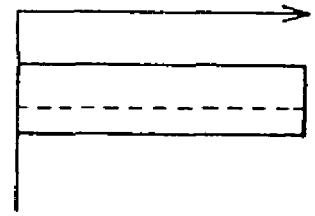

In the second embodiment of the present invention shown in FIG. 3, after completing the processes shown in FIG. 1, (3) the SOI layer 3' is made thinner by removing a part of its surface. Then, the substrate is charged into the ion implantation apparatus again and 4) oxygen ion implantation is carried out by applying such an accelerating voltage that the peak of the distribution of implanted oxygen ions is located at the lower portion of the already formed BOX layer 4' as shown in FIG. 2. Thereafter, the substrate is discharged from the ion implantation apparatus and, then, a SIMOX structure having an SOI layer 3 and a BOX layer 4 is formed by applying a high temperature heat treatment in a heat treatment furnace.

Using the method shown in FIG. 3, it is possible to implant oxygen ions in a desired position without changing the accelerating voltage used in the second oxygen ion implantation so much from the accelerating voltage used in the first oxygen ion implantation, comparing with the method shown in FIG. 2. As a consequence, the freedom in the combination of the accelerating voltage used in the second oxygen ion implantation expands within the capacity range of the ion implantation apparatus employed and, for this reason, it becomes possible to expand the freedom in the thicknesses of the SOI and BOX layers finally formed. At the same time, the load imposed on the ion implantation apparatus by the change of operating conditions is alleviated. Note that techniques such as reactive ion etching, etching using a mixed solution of hydrofluoric acid and nitrous acid, mechanical polishing, etc. can be used as the method of removing a part of the SOI layer surface before applying the second oxygen ion implantation.

Figure 4:
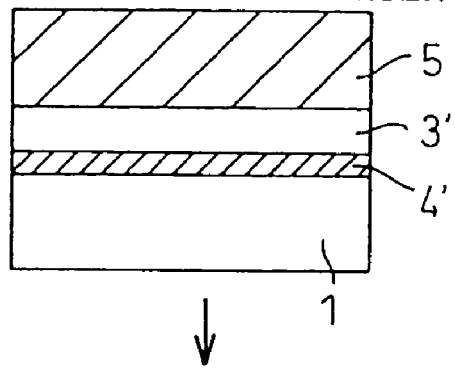
FIG. 4 shows production processes (3), (4), (5) and (6) of a SIMOX substrate according to a third embodiment of the present invention and schematic sectional illustrations of silicon substrates at the production processes, and distributions of oxygen concentration in the silicon substrates.
Figure 4:
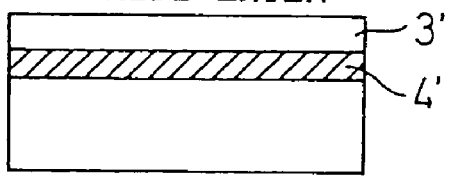
Figure 4:
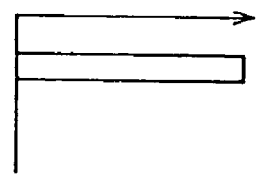
Figure 4:
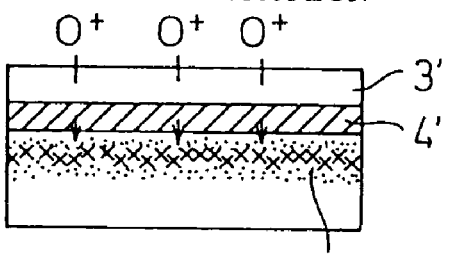
Figure 4:
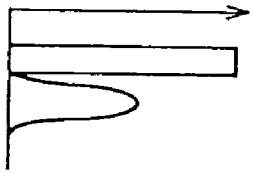
Figure 4:
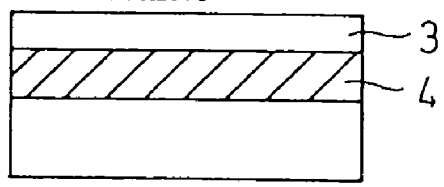
Figure 4:
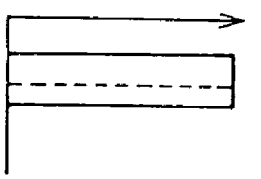

In the third embodiment of the present invention shown in FIG. 4, after completing the processes shown in FIG. 1, (3) a thermally-grown oxide layer 5 is formed on the surface of the SOI layer 3', and then (4) the oxide layer is removed. A solvent to selectively dissolve the oxide layer or the like may be used for the removal. Subsequently, a SIMOX structure having an SOI layer 3 and a BOX layer 4 is formed by applying (5) an ion implantation in the same manner as in FIG. 2 and (6) a heat treatment. By this method, too, the same effects as those explained in the description of the second embodiment are expected to show.

It has to be noted that, in the first to third embodiments of the present invention shown in FIGS. 2 to 4, respectively, it is acceptable to form an oxide layer on the surface of a silicon substrate prior to the first oxygen ion implantation and to remove the oxide layer using a solvent as described above after the first oxygen ion implantation or the first high temperature heat treatment immediately thereafter. In order that the oxide layer formed on the substrate surface is not erased by the sputtering during the oxygen ion implantation in the above case, it is desirable to form the oxide layer in a thickness of 30 nm or more. In order to obtain the SOI layer after the high temperature heat treatment, on the other hand, it is necessary to restrict the thickness of the surface oxide layer to 400 nm or so at the largest.

The first to third embodiments of the present invention shown in FIGS. 2 to 4, respectively, are examples wherein the oxygen ion implantation is repeated twice in total, but the partial removal of the SOI layer and the subsequent oxygen ion implantation and high temperature heat treatment may be repeated as long as the SOI layer does not disappear. When an accelerating voltage of 150 to 250 kV and a dosing amount of 2 to $6 \times 10^{17}$ cm$^{-2}$ are applied to the oxygen ion implantation, as explained earlier, it is desirable that the total removal depth of the surface of the SOI layer or the surface of the silicon single crystal is 20 nm or more in order to obtain the effects of the present invention, and 300 nm or less in order to prevent the SOI layer from disappearing. In this case, it is possible to form the finally obtained SOI layer in any desired thickness up to an upper limit of 400 nm or so, as long as it is within a range not letting the SOI layer disappear, by appropriately controlling process conditions.

In the first to third embodiments of the present invention shown in FIGS. 2 to 4, respectively, the quality of the BOX layer is also improved with respect to the pinhole defects, the breakdown electric field and so forth, as the thickness of the BOX layer increases. The extent of the quality improvement becomes greater as the total of the dosing amounts at the second and subsequent oxygen ion implantation processes increases and, to obtain tangible improvement effects with respect to these quality aspects of the BOX layer, it is desirable that the total of the dosing amounts at the second and subsequent oxygen ion implantation processes is at least $0.1 \times 10^{17}$ cm$^{-2}$ or more, more preferably, $0.5 \times 10^{17}$ cm$^{-2}$ or more.

With regard to an apparatus used for applying the oxygen ion implantation according to the present invention, any apparatus is acceptable as long as it is capable of accelerating oxygen ions by applying a voltage and thus implanting them into a silicon wafer through the surface, and there are no specific restrictions as to its type, ion implanting method, etc.

With regard to the conditions of the first oxygen ion implantation in the production of the SIMOX substrate according to the present invention, the conditions in the low dose range are already shown. However, the conditions of the first oxygen ion implantation are not necessarily limited to those of the low dose range, and the conditions of the so-called middle dose or high dose range where the dosing amount is larger than those shown above may be applied. For the purpose of improving the BOX layer quality, such as its thickness, pinhole defects, breakdown electric field, and so forth, however, greater effects are expected when the present invention is applied to the cases where the conditions of the low dose range are used and much improvement in the quality is required. It is also acceptable to divide each of the first oxygen ion implantation and the second and subsequent oxygen ion implantation into two or more steps. For the purpose of reducing the crystal defects in the SOI layer, it is desirable that the temperature of the substrate at least during the first oxygen ion implantation is approximately 500° C. to 600° C.

With regard to an apparatus used for a high temperature heat treatment, there is no specific restriction as long as the apparatus is capable of carrying out a heat treatment at a desired temperature for a desired period of time. Typically, a high temperature heat treatment furnace can be named as a desirable apparatus for the purpose. A lamp anneal furnace can also be applied, as long as it satisfies required performances in terms of treatment temperature, time, etc. The conditions of a heat treatment furnace other than the treatment temperature and time, such as charging temperature, heating rate, cooling rate, and so forth are not limited specifically, and the heating or cooling may be conducted in two or more steps.

With regard to the conditions of a high temperature heat treatment, it is desirable, for removing the damage caused by the ion implantation and obtaining a high quality SOI structure, to conduct the heat treatment at a temperature of 1,300° C. or higher but below the melting point of silicon. However, the heat treatment temperature is not limited to the above temperature range. A non-oxidizing atmosphere using an inert gas or an atmosphere containing a small amount of oxygen added to the non-oxidizing atmosphere is desirable as the atmosphere of the heat treatment for removing the damage. However, it is not necessarily limited to those atmospheres, and an oxidizing atmosphere is also acceptable. Argon, nitrogen, and the like are used, typically, as the inert gas. However, it is not necessarily limited to them. Further, a high temperature oxidizing treatment may be applied subsequent to the high temperature heat treatment.

Examples of the present invention are explained hereafter based on the schematic sectional illustrations in FIGS. 1 to 4.

Oxygen ions were implanted in the surface of p-type (100) silicon substrates at an accelerating voltage of 180 kV and up to an implantation amount of $4\times10^{17}$ cm$^{-2}$, according to the processes shown in FIG. 1. The temperature of the substrates during the ion implantation was set at 600° C. for the purpose of maintaining their crystallinity. Then, the substrates were discharged from the ion implantation apparatus and subjected to a heat treatment at a temperature of 1,300° C. or higher for 6 h. in a heat treatment furnace to form the SIMOX structure. The heat treatment was conducted in an atmosphere of argon mixed with 1% of or less of oxygen. The structure of the substrate discharged from the furnace was evaluated by spectroscopic-ellipsometry and, as a result, the SOI layer measured roughly 340 nm in thickness, and the BOX layer was 85 nm thick.

In the first example according to the first embodiment of the present invention shown in FIG. 2, after completing the processes shown in FIG. 1, the substrate was charged into the ion implantation apparatus once again and subjected to another oxygen ion implantation process at an accelerating voltage of 210 kV and up to an implantation amount of $2\times10^{17}$ cm$^{-2}$. The temperature of the substrate during the ion implantation was set, like in the first implantation, at 600° C. Then, the substrate was discharged from the ion implantation apparatus and subjected to a heat treatment process at a temperature of 1,300° C. or higher for 6 h. in an atmosphere of argon mixed with 1% of or less of oxygen in the heat treatment furnace. After the heat treatment, the substrate discharged from the furnace was evaluated, as described earlier, by spectroscopic-ellipsometry. As a result, the SOI layer measured roughly 280 nm in thickness, and the BOX layer 130 nm.

In the second example according to the second embodiment of the present invention shown in FIG. 3, after completing the processes shown in FIG. 1, the surface of an SOI layer was etched with a mixed solution of hydrofluoric acid and nitrous acid up to a depth of about 120 nm to obtain an SOI layer roughly 200 nm in thickness. Then, the substrate was charged into the ion implantation apparatus once again and subjected to an oxygen ion implantation process at an accelerating voltage of 190 kV and up to an implantation amount of $2\times10^{17}$ cm$^{-2}$. The temperature of the substrate during the ion implantation was set, as in the first implantation, at 600° C. Then, the substrate was discharged from the ion implantation apparatus and subjected to a heat treatment at a temperature of 1,300° C. or higher for 6 h. in an atmosphere of argon mixed with 1% of or less of oxygen in the heat treatment furnace. After the heat treatment, the substrate discharged from the furnace was evaluated, as described earlier, by spectroscopic-ellipsometry. As a result, the SOI layer measured roughly 160 nm in thickness, and the BOX layer 130 nm.

In the third example according to the third embodiment of the present invention shown in FIG. 4, after completing the processes shown in FIG. 1, a thermally-grown oxide layer roughly 270 nm in thickness was formed on a surface of an SOI layer at a temperature of 1,000° C. or higher and, then, the oxide layer was removed using a solution of hydrofluoric acid. As a result, a part of the SOI layer about 220 nm in thickness remained on the substrate. The ion implantation and heat treatment were conducted subsequently under the same conditions as in the second example. The SOI layer and BOX layer finally obtained were about 160 nm and 130 nm in thickness, respectively.

The quality of the BOX layers of the samples thus obtained was evaluated and compared. Besides the samples of the above three examples, also evaluated were a sample of a conventional example produced through the processes shown in FIG. 1 and a sample of a comparative example produced through the processes shown in FIG. 1 such that the oxygen ion implantation amount was $6\times10^{17}$ cm$^{-2}$, which was the same amount as the total implantation amount of the examples according to the present invention.

Figure 5:
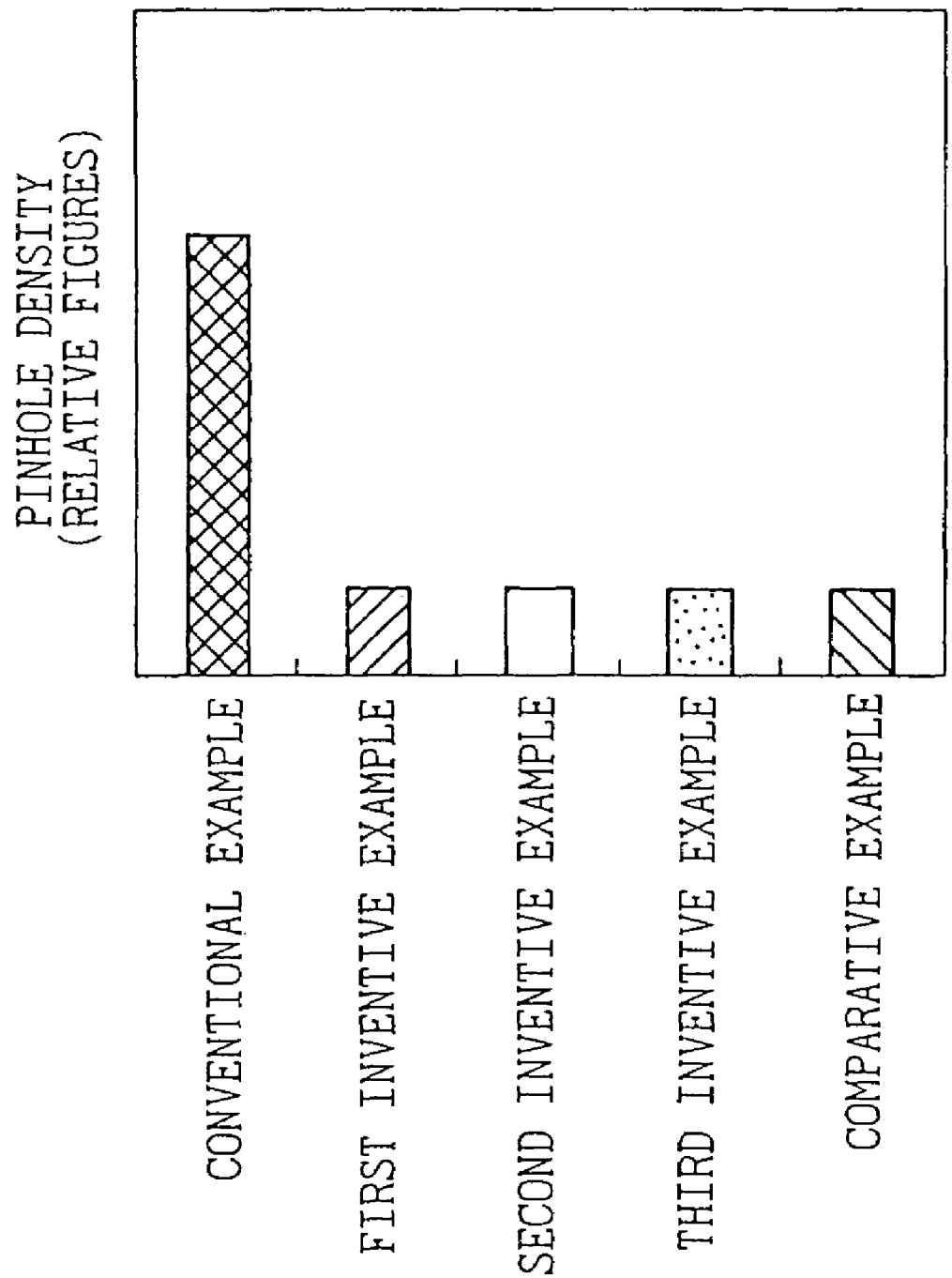
FIG. 5 is a graph showing a density of pinhole defects in a BOX layer, comparing the first to third exemplary embodiments of the present invention, a conventional example and a comparative example.

The pinhole defects in the BOX layer were evaluated by the copper plating method, wherein: each of the samples was arranged so that only the top surface of the substrate touched an electrolyte containing copper ions and the bottom surface of the substrate touched a cathode, and an anode was placed in the electrolyte; then, copper plated portions were made to form on the top surface of the substrate immediately above the portions where pinholes existed in the BOX layer, by applying to the anode and cathode a low voltage of about 10 V which would not destroy the BOX layer; and the density of the pinholes in the BOX layers was evaluated by counting the number of the copper plated portions. FIG. 5 shows the pinhole density in each of the samples of the conventional example, the first to third examples of the present invention and the comparative example. It was made clear that, in the samples of the first to third examples and the comparative example, the pinhole density was reduced to about one fifth that of the sample of the conventional example, and that the number of pinholes decreased as the total amount of the oxygen implantation increased.

In succession, the breakdown electric field of the BOX layer of each sample was evaluated, wherein: the SOI layer of each sample was divided into sections 1 mm² each by lithography and etching and an Al electrode was formed on the top surface of each of the sections by vacuum deposition; an Au film was formed on the bottom surface of each sample substrate as the other electrode by vacuum deposition; and the breakdown electric field of the BOX layer was evaluated by applying a voltage to the Al electrodes and the Au electrode on the bottom surface of each substrate, thus imposing an electric field on the BOX layer, and measuring the current flowing at the time. Here, the electric field strength was calculated by dividing the voltage imposed on both electrodes by the thickness of the BOX layer.

Figure 6:
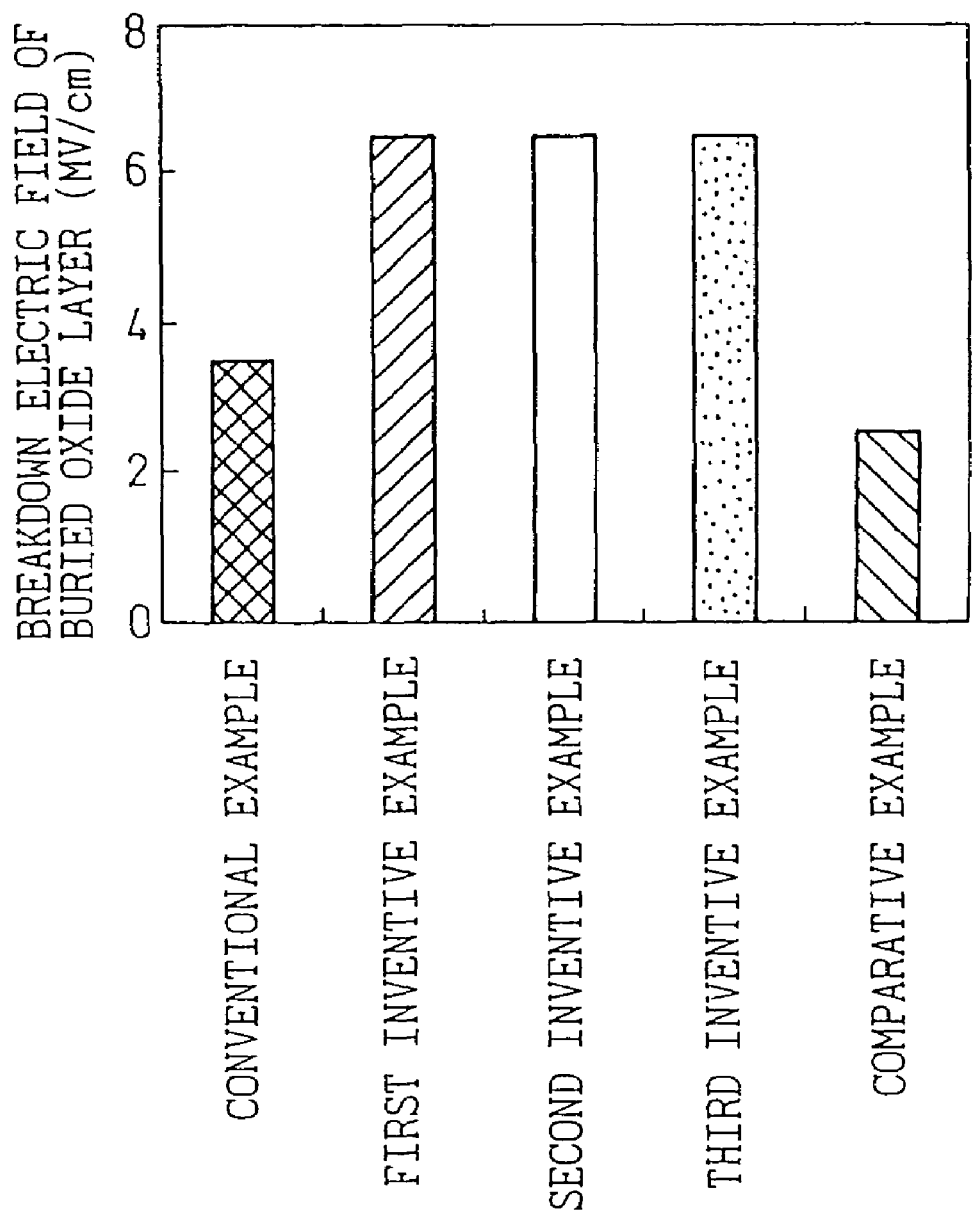
FIG. 6 is a graph showing a breakdown electric field of the BOX layer, comparing the first to third exemplary embodiments of the present invention, a conventional example and a comparative example.

FIG. 6 shows the breakdown electric field of the BOX layer in each of the samples of the conventional example, the first to third examples and the comparative example. It is clear in the figure that, in the samples of the first to third examples, the breakdown electric field of the BOX layer is higher than that in the conventional example. It was found out, on the other hand, that, in the sample of the comparative example produced with the same dosing amount as in the first to third examples, the dielectric breakdown characteristic of the BOX layer was inferior to that of the sample of the conventional example. This is presumably because the number of the silicon islands in the BOX layer was increased by simply increasing the dosing amount of the oxygen ions and, as a result, the breakdown electric field decreased, contrary to expectation.

Figure 7:
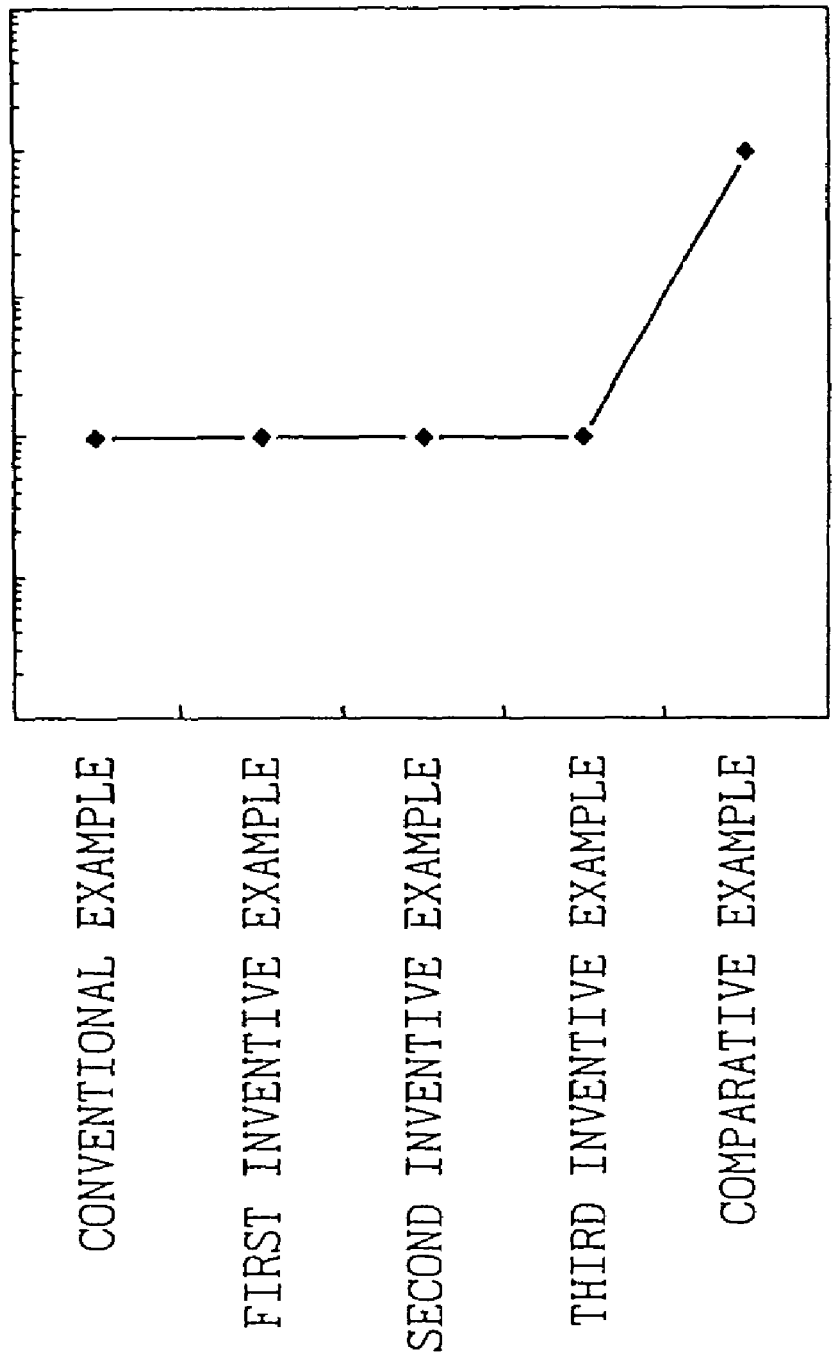
FIG. 7 is a graph showing a density of defects in the SOI layer, comparing the first to third exemplary embodiment of the present invention, a conventional example and a comparative example.

FIG. 7 shows the density of defects evaluated in terms of etch pit in the SOI layer of each sample. It is clear from the figure that, in the samples of the first to third examples, the defect density is kept at the same level as in the conventional example, despite the fact that they underwent additional ion implantation. The figure also shows that, in the sample of the comparative example, to which the same amount of oxygen ions as in the samples of the first to third examples was implanted in one step, in contrast, the defect density of the SOI layer is higher by more than 10%, which indicates that the damage increases as the amount of the implanted ions increases. This result can be interpreted as follows: in the first to third examples, the oxygen ions were implanted at the second oxygen ion implantation in the lower side of the BOX layer formed through the first heat treatment and, for this reason, most of the damage generated at the second implantation was introduced to the inside or the lower side of the BOX layer and, as a consequence, the influence of defect formation on the finally formed SOI layer was alleviated.

Summarizing the above results, it is clear that, in the first to third examples according to the present invention, the increase of the defects in the SOI layer is suppressed in spite of the increase in the oxygen ion implantation amount, while the thickness of the BOX layer is increased, the number of pinholes in the BOX layer is decreased and the breakdown electric field is raised, compared with the conventional example.

As is explained above, the present invention makes it possible, in the production of a SIMOX substrate, to obtain a high quality BOX layer whose thickness is heavier than that of a SIMOX substrate produced by a conventional method, by applying to a SIMOX substrate produced by a conventional method additional oxygen implantation so that the peak position of the distribution of implanted oxygen is located at the portion lower than the interface between the BOX layer already formed and the substrate thereunder and, then, a high temperature heat treatment.

The invention claimed is:

1. A method of producing a Separation by Implanted Oxygen ("SIMOX") substrate using a silicon substrate, comprising:
   a) implanting oxygen ions in the silicon substrate;
   b) after step (a), forming a buried oxide layer in the silicon substrate by applying a high temperature heat treatment;
   c) after step (b), implanting further oxygen ions in the silicon substrate so that a peak position of a distribution of the implanted oxygen is located at a portion that is lower than an interface between the formed buried oxide layer and the substrate provide thereunder; and
   d) after step (c), applying a further high temperature heat treatment.

2. The method according to claim 1, further comprising:
   e) between steps (b) and (c), partially removing a surface silicon layer of the silicon substrate by at least one of:
      i. etching the surface layer using a reactive substance,
      ii. oxidizing the surface layer and removing the formed surface oxide layer, and
      iii. polishing the surface layer.

3. A method of producing a Separation by Implanted Oxygen ("SIMOX") substrate using a silicon substrate, comprising:
   a) implanting first oxygen ions in the silicon substrate;
   b) after step (a), forming a buried oxide layer in the silicon substrate by applying a high temperature heat treatment;
   c) after step (b), implanting second oxygen ions in the silicon substrate so that a dosing amount of the implantation of second oxygen ions is at most a total dosing amount of the implantation of the first oxygen ions, and so that a peak position of a distribution of the second implanted oxygen ions is located at a portion which is lower than an interface between the formed buried oxide layer and the silicon substrate thereunder; and
   d) after step (c), applying a further high temperature heat treatment.

4. The method according to claim 3, further comprising:
   e) between steps (b) and (c), partially removing a surface silicon layer of the silicon substrate by at least one of:
      i. etching the surface layer using a reactive substance,
      ii. oxidizing the surface layer and removing the formed surface oxide layer, and
      iii. polishing the surface layer.

5. A method of producing a Separation by Implanted Oxygen ("SIMOX") substrate using a silicon substrate, comprising:
   a) implanting first oxygen ions in the silicon substrate;
   b) after step (a), forming a buried oxide layer in the silicon substrate by applying a high temperature heat treatment;
   c) after step (b), implanting second oxygen ions in the silicon substrate so that an accelerating energy applied to the implantation of the first oxygen ions is different from that applied to the implantation of the second oxygen ions, and that a peak position of a distribution of the second implanted oxygen ions is located at a portion which is lower than an interface between the formed buried oxide layer and the silicon substrate thereunder; and d) after step (c), applying a further high temperature heat treatment.

6. The method according to claim 5, further comprising:
e) between steps (b) and (c), partially removing a surface silicon layer of the silicon substrate by at least one of:
  i. etching the surface layer using a reactive substance,
  ii. oxidizing the surface layer and removing the formed surface oxide layer, and
  iii. polishing the surface layer.

7. A method of producing a Separation by Implanted Oxygen ("SIMOX") substrate using a silicon substrate, comprising:
a) implanting first oxygen ions in the silicon substrate;
b) after step (a), forming a buried oxide layer in the silicon substrate by applying a high temperature heat treatment;
c) after step (b), implanting second oxygen ions in the silicon substrate so that a dosing amount of the implantation of the second oxygen ions does not exceed a total dosing amount of the first oxygen ions, so that an accelerating energy applied to the implantation of the first oxygen ions is different from that applied to the implantation of the second oxygen ions, and so that a peak position of a distribution of the second implanted oxygen ions is located at a portion which is lower than an interface between the formed buried oxide layer and the silicon substrate thereunder; and
d) after step (c), applying a further high temperature heat treatment.

8. The method according to claim 7, further comprising:
e) between steps (b) and (c), partially removing a surface silicon layer of the silicon substrate by at least one of:
  i. etching the surface layer using a reactive substance,
  ii. oxidizing the surface layer and removing the formed surface oxide layer, and
  iii. polishing the surface layer.

9. A Separation by Implanted Oxygen ("SIMOX") substrate formed by implanting oxygen ions in a silicon substrate, comprising:
a buried oxide layer provided in the silicon substrate by applying a high temperature heat treatment,
wherein further oxygen ions are implanted in the silicon substrate so that a peak position of a distribution of the implanted oxygen is located at a portion that is lower than an interface between the formed buried oxide layer and the substrate provide thereunder,
wherein a further high temperature heat treatment is applied to the silicon substrate, and
wherein a thickness of a surface silicon layer of the SIMOX substrate is approximately 10 nm to 400 nm, and a thickness of the buried oxide layer is approximately 60 nm to 250 nm.

10. The SIMOX substrate according to claim 9, wherein a surface silicon layer of the silicon substrate is partially removed before the further implantation by at least one of:
e) between steps (b) and (c), partially removing a surface silicon layer of the silicon substrate by at least one of:
  i. etching the surface layer using a reactive substance,
  ii. oxidizing the surface layer and removing the formed surface oxide layer, and
  iii. polishing the surface layer.

11. A Separation by Implanted Oxygen ("SIMOX") substrate formed by implanting first oxygen ions in a silicon substrate, comprising:
a buried oxide layer provided in the silicon substrate by applying a high temperature heat treatment,
wherein further oxygen ions are implanted in the silicon substrate so that a dosing amount of the implantation of second oxygen ions is at most a total dosing amount of the implantation of the first oxygen ions, and so that a peak position of a distribution of the second implanted oxygen ions is located at a portion which is lower than an interface between the formed buried oxide layer and the silicon substrate thereunder,
wherein a further high temperature heat treatment is applied to the silicon substrate, and
wherein a thickness of a surface silicon layer of the SIMOX substrate is approximately 10 nm to 400 nm, and a thickness of the buried oxide layer is approximately 60 nm to 250 nm.

12. The SIMOX substrate according to claim 11, wherein a surface silicon layer of the silicon substrate is partially removed before the further implantation by at least one of:
  i. etching the surface layer using a reactive substance,
  ii. oxidizing the surface layer and removing the formed surface oxide layer, and
  iii. polishing the surface layer.

13. A Separation by Implanted Oxygen ("SIMOX") substrate formed by implanting first oxygen ions in a silicon substrate, comprising:
a buried oxide layer provided in the silicon substrate by applying a high temperature heat treatment,
wherein further oxygen ions are implanted in the silicon substrate so that an accelerating energy applied to the implantation of the first oxygen ions is different from that applied to the implantation of the second oxygen ions, and that a peak position of a distribution of the second implanted oxygen ions is located at a portion which is lower than an interface between the formed buried oxide layer and the silicon substrate thereunder,
wherein a further high temperature heat treatment is applied to the silicon substrate, and
wherein a thickness of a surface silicon layer of the SIMOX substrate is approximately 10 nm to 400 nm, and a thickness of the buried oxide layer is approximately 60 nm to 250 nm.

14. The SIMOX substrate according to claim 13, wherein a surface silicon layer of the silicon substrate is partially removed before the further implantation by at least one of:
  i. etching the surface layer using a reactive substance,
  ii. oxidizing the surface layer and removing the formed surface oxide layer, and
  iii. polishing the surface layer.

15. A Separation by Implanted Oxygen ("SIMOX") substrate formed by implanting first oxygen ions in a silicon substrate, comprising:
a buried oxide layer provided in the silicon substrate by applying a high temperature heat treatment,
wherein further oxygen ions are implanted in the silicon substrate so that a dosing amount of the implantation of the second oxygen ions does not exceed a total dosing amount of the first oxygen ions, so that an accelerating energy applied to the implantation of the first oxygen ions is different from that applied to the implantation of the second oxygen ions, and so that a peak position of a distribution of the second implanted oxygen ions is located at a portion which is lower than an interface between the formed buried oxide layer and the silicon substrate thereunder,
wherein a further high temperature heat treatment is applied to the silicon substrate, and wherein a thickness of a surface silicon layer of the SIMOX substrate is approximately 10 nm to 400 nm, and a thickness of the buried oxide layer is approximately 60 nm to 250 nm.

16. The SIMOX substrate according to claim 15, wherein a surface silicon layer of the silicon substrate is partially removed before the further implantation by at least one of:

i. etching the surface layer using a reactive substance, ii. oxidizing the surface layer and removing the formed surface oxide layer, and iii. polishing the surface layer.

* * * * *